US012745682B2

(12) United States Patent
Liu et al.

(10) Patent No.: US 12,745,682 B2
(45) Date of Patent: Sep. 22, 2026

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Jia Liu, Yokohama (JP); Tatsuo Tonedachi, Yamato (JP)

(73) Assignees: KABUSHIKI KAISHA TOSHIBA, Kawasaki (JP); TOSHIBA ELECTRONIC DEVICES & STORAGE CORPORATION, Kawasaki (JP)

( * ) Notice: Subject to any disclaimer, the term of this patent is extended or adjusted under 35 U.S.C. 154(b) by 362 days.

(21) Appl. No.: 18/599,238

(22) Filed: Mar. 8, 2024

(65) Prior Publication Data

US 2025/0046774 A1 Feb. 6, 2025

(30) Foreign Application Priority Data

Aug. 4, 2023 (JP) ................................ 2023-127828

(51) Int. Cl.

| | |
|---|---|
| ***H01L 25/16*** | (2023.01) |
| ***H01L 31/02*** | (2006.01) |
| ***H01L 33/56*** | (2010.01) |
| ***H01L 33/62*** | (2010.01) |
| ***H10F 77/00*** | (2025.01) |
| ***H10H 20/854*** | (2025.01) |
| ***H10H 20/857*** | (2025.01) |
| ***H10W 90/00*** | (2026.01) |

(52) U.S. Cl.

CPC .......... *H10W 90/00* (2026.01); *H10F 77/933* (2025.01); *H10H 20/854* (2025.01); *H10H 20/857* (2025.01)

(58) Field of Classification Search

CPC ... H10F 77/933; H10H 20/857; H10W 90/00; H04B 10/29; H04B 10/40; H04B 10/801; H04B 10/802

See application file for complete search history.

(56) References Cited

U.S. PATENT DOCUMENTS

| | | | |
|---|---|---|---|
| 8,816,310 B2 | 8/2014 | Hoshino et al. | |
| 11,367,715 B2 | 6/2022 | Tonedachi | |
| 11,462,525 B2 | 10/2022 | Fujihara et al. | |
| 2006/0027735 A1* | 2/2006 | Matsuyama ..... | H03K 17/04106 250/214 R |
| 2021/0247567 A1 | 8/2021 | Fujihara et al. | |
| 2022/0302337 A1 | 9/2022 | Hori et al. | |

FOREIGN PATENT DOCUMENTS

| | | |
|---|---|---|
| JP | 2011166077 A | 8/2011 |
| JP | 2021089971 A | 6/2021 |
| JP | 2021125620 A | 8/2021 |
| JP | 2021125670 A | 8/2021 |
| JP | 2022146698 A | 10/2022 |

* cited by examiner

*Primary Examiner* — John A Bodnar

(74) *Attorney, Agent, or Firm* — Holtz, Holtz & Volek PC

(57) ABSTRACT

According to one embodiment, a semiconductor device includes: a first substrate; a first transistor provided on the first substrate; a light receiving element; and a light emitting element provided on the light receiving element, wherein the first substrate, the first transistor, the light emitting element, and the light receiving element are disposed sequentially in a first direction.

17 Claims, 13 Drawing Sheets

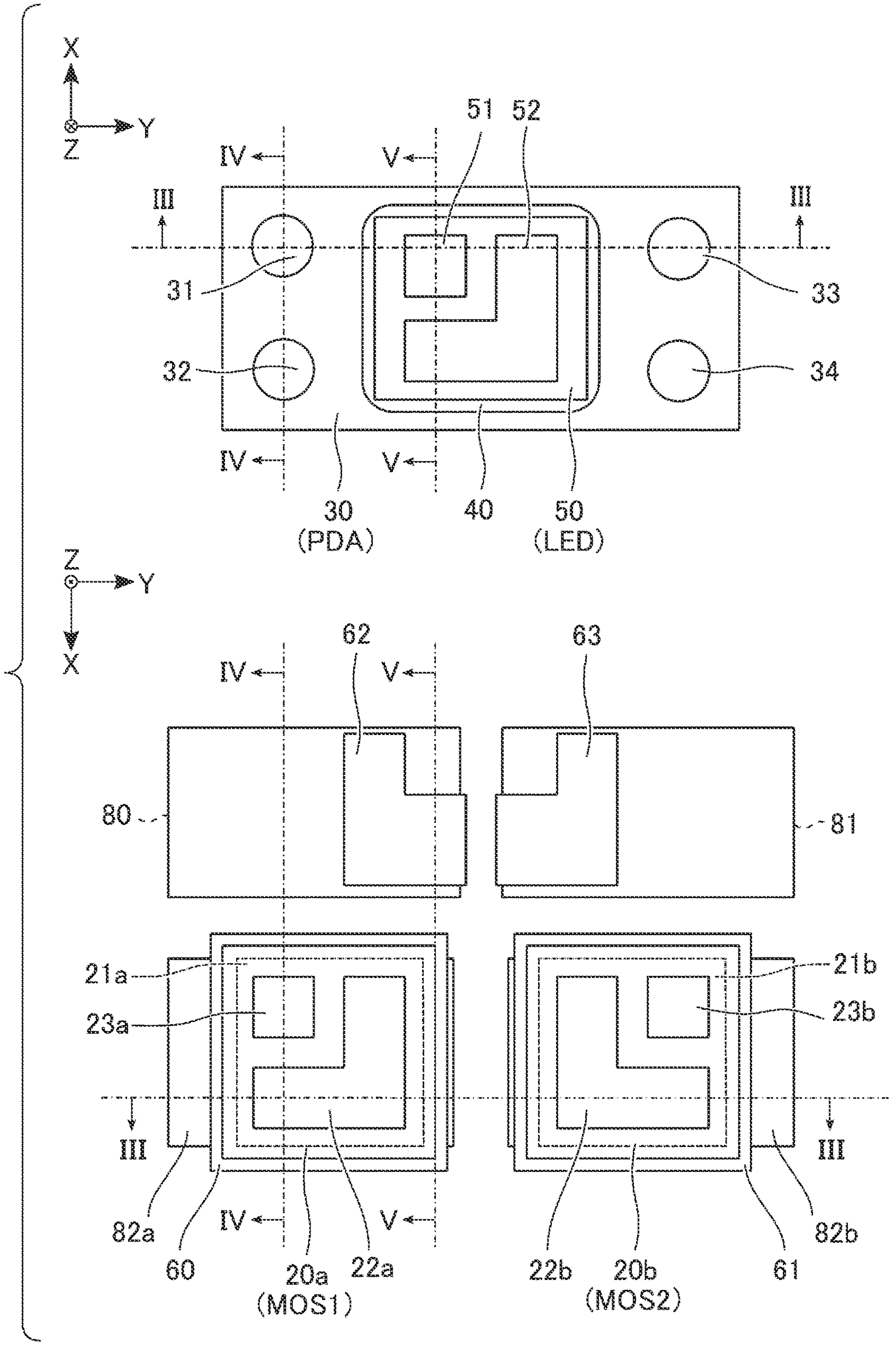
F I G. 2

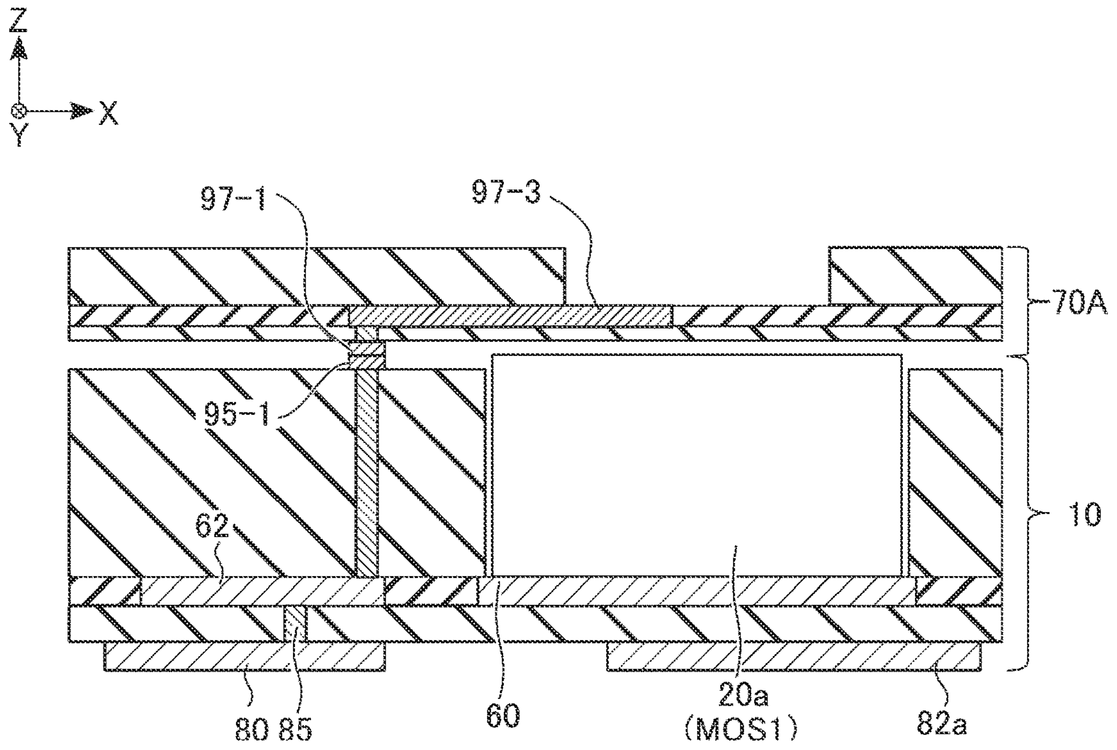
F I G. 13
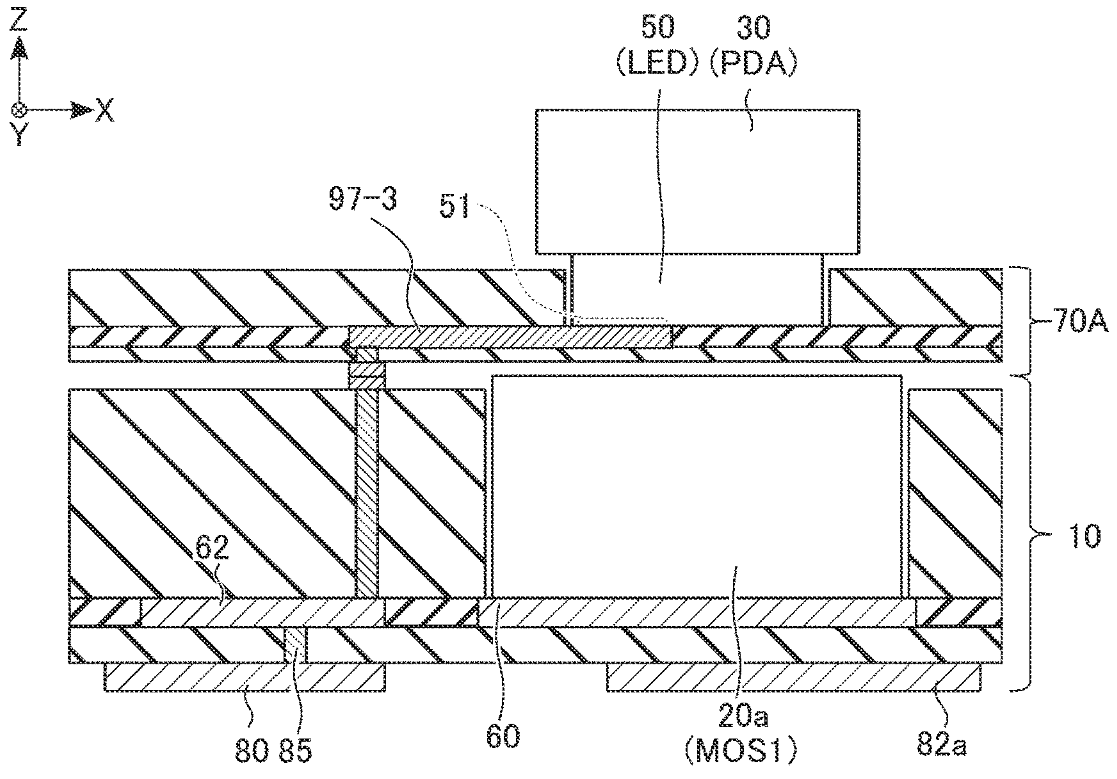
F I G. 14

1B
30 (PDA)
50 (LED)
93
94
22b
20b (MOS2)
21b
82b
61
23b
90
20a (MOS1)
21a
60
91
82a
22a
92
23a
31
98
32
97
81B
80B

SEMICONDUCTOR DEVICE

CROSS-REFERENCE TO RELATED APPLICATIONS

This application is based upon and claims the benefit of priority from Japanese Patent Application No. 2023-127828, filed Aug. 4, 2023, the entire contents of which are incorporated herein by reference.

FIELD

Embodiments described herein relate generally to a semiconductor device.

BACKGROUND

A photo relay device is known as a semiconductor device. The photo relay device is a semiconductor relay device including a light emitting element and a light receiving element. The photo relay device is a contactless relay, and is used for transmission of an AC signal or a DC signal.

BRIEF DESCRIPTION OF DRAWINGS

FIG. 2 is a plan view showing a planar layout of various elements included in the photo relay device according to the first embodiment.

FIG. 13 is a cross-sectional view of a cross-sectional structure in a manufacturing process of the photo relay device according to the second embodiment.

FIG. 14 is a cross-sectional view of a cross-sectional structure in a manufacturing process of the photo relay device according to the second embodiment.

DETAILED DESCRIPTION

Figure 1:
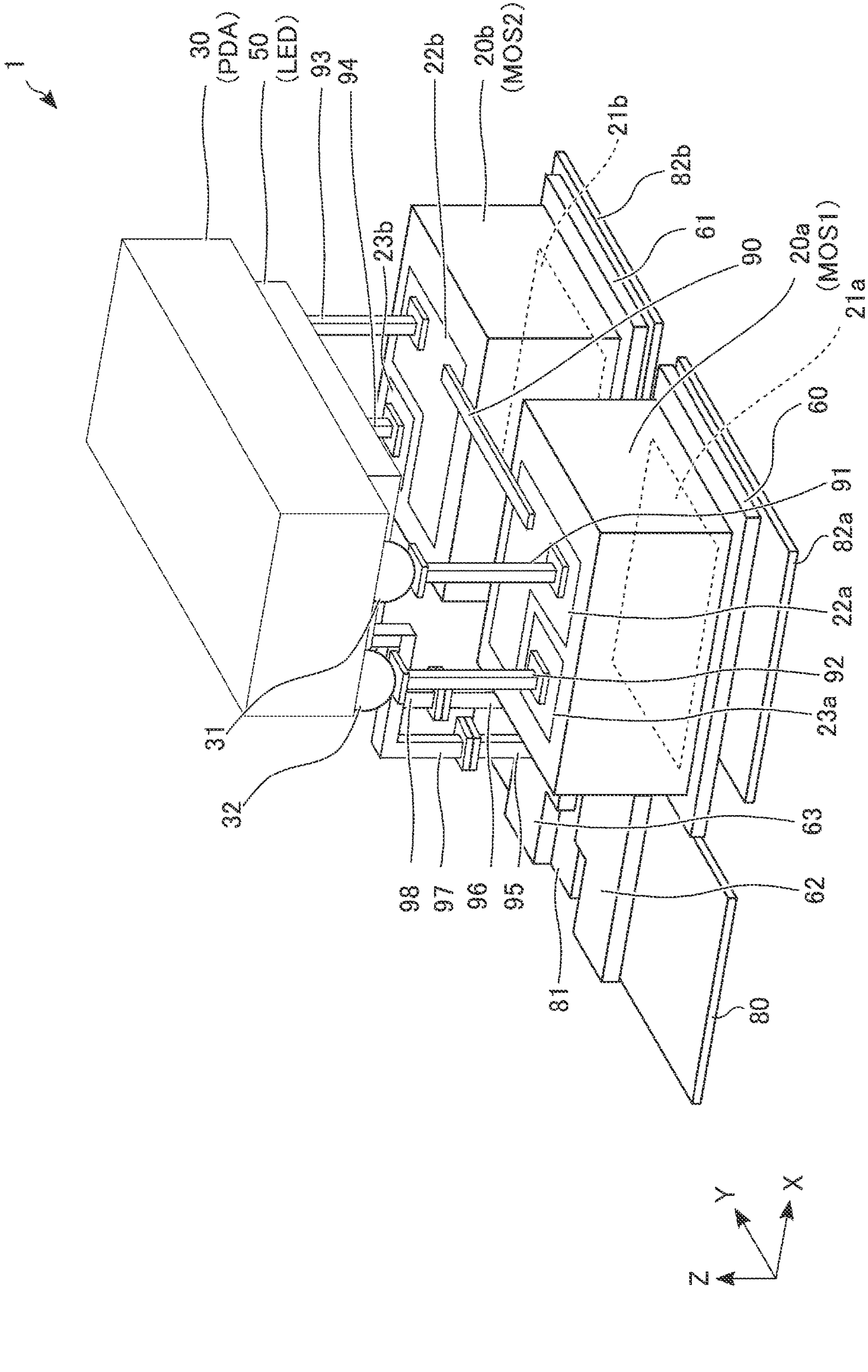
FIG. 1 is a perspective view of an overall configuration of a photo relay device according to a first embodiment.

In general, according to one embodiment, a semiconductor device includes: a first substrate; a first transistor provided on the first substrate; a light receiving element; and a light emitting element provided on the light receiving element, wherein the first substrate, the first transistor, the light emitting element, and the light receiving element are disposed sequentially in a first direction.

Hereinafter, embodiments will be described with reference to the drawings. Each embodiment exemplifies an apparatus and a method for embodying the technical idea of the invention. The drawings are schematic or conceptual, and dimensions, ratios, and the like of each drawing are not necessarily the same as the actual.

Note that, in the following description, components having substantially the same functions and configurations are denoted by the same reference numerals. In a case where it is not necessary to distinguish elements indicated by reference numerals including the same character from each other, these elements are referred to by reference numerals including only a character.

In the description that follows, a first element being "coupled" to a second element encompasses a case where the first element is indirectly coupled to the second element via an intermediate element that is constantly or selectively conductive, or is directly coupled to the second element without intervention of an intermediate element.

A first embodiment will be described. In the present embodiment, a photo relay device will be described as an example of a semiconductor device.

FIG. 1 is a perspective view of an overall configuration of a photo relay device according to a first embodiment. FIG. 2 is a plan view showing a planar layout of various elements included in the photo relay device in FIG. 1.

As illustrated in FIGS. 1 and 2, a photo relay device 1 includes two transistors **20*a* and 20*b*, a light receiving element 30, an adhesive layer 40, a light emitting element 50, electrodes 60, 61, 62, and 63, input terminals 80 and 81, output terminals 82*a* and 82*b*, and interconnects 90, 91, 92, 93, 94, 95, 96, 97, and 98. The transistors 20*a* and 20*b* are, for example, metal oxide semiconductor field effect transistors (MOSFETs). Hereinafter, a case where the transistors 20*a* and 20*b* are MOSFETs (MOSFETs 20*a* and 20*b*) will be described. The MOSFETs 20*a* and 20*b* are disposed so as to face the light receiving element 30, the adhesive layer 40, and the light emitting element 50**.

Hereinafter, a direction from the MOSFETs **20*a* and 20*b* toward the light receiving element 30 and the light emitting element 50 is defined as a Z direction or an upward direction. A direction from the light receiving element 30 and the light emitting element 50 toward the MOSFETs 20*a* and 20*b* is defined as a downward direction. A plane intersecting the Z direction is defined as an XY plane. Directions intersecting each other in the XY plane are defined as an X direction and a Y direction. That is, an upper part of the plan view illustrated in FIG. 2 corresponds to the planar layout of the light receiving element 30, the adhesive layer 40, and the light emitting element 50 in a case where the photo relay device 1 is viewed in the upward direction. In addition, a lower part of the plan view illustrated in FIG. 2 corresponds to the planar layout of the MOSFETs 20*a* and 20*b*, the electrodes 60, 61, 62, and 63, the input terminals 80 and 81, and the output terminals 82***a* and 82*b* in a case where the photo relay device 1 is viewed in the downward direction.

The MOSFETs 20*a* and 20*b* are, for example, enhancement type n-channel MOS transistors. The MOSFETs 20*a* and 20*b* are used to control an AC signal or a DC signal to be transmitted. In a case where the MOSFETs 20*a* and 20*b* are turned on, the photo relay device 1 transmits a signal, and in a case where the MOSFETs 20*a* and 20*b* are turned off, the photo relay device 1 does not transmit a signal.

The MOSFET 20*a* (hereinafter, also referred to as "MOS1") includes electrodes 21*a*, 22*a*, and 23*a*. The electrode 21*a* functions as a drain electrode of the MOSFET 20*a*. The electrode 22*a* functions as a source electrode of the MOSFET 20*a*. The electrode 23*a* functions as a gate electrode of the MOSFET 20*a*. The electrode 21*a* is provided on a bottom surface of the MOSFET 20*a*. The electrodes 22*a* and 23*a* are provided on a top surface of the MOSFET 20*a*.

The MOSFET 20*b* (hereinafter, also referred to as "MOS2") has the same structure as the MOSFET 20*a*. For example, the MOSFET 20*b* is disposed side by side with the MOSFET 20*a* in the Y direction. Note that the arrangement of the MOSFET 20*a* and the MOSFET 20*b* is arbitrary.

The MOSFET 20*b* includes electrodes 21*b*, 22*b*, and 23*b*. The electrode 21*b* functions as a drain electrode of the MOSFET 20*b*. The electrode 22*b* functions as a source electrode of the MOSFET 20*b*. The electrode 23*b* functions as a gate electrode of the MOSFET 20*b*. The electrode 21*b* is provided on a bottom surface of the MOSFET 20*b*. The electrodes 22*b* and 23*b* are provided on a top surface of the MOSFET 20*b*. In the examples of FIGS. 1 and 2, the electrodes 22*a* and 23*a* of the MOSFET 20*a* are disposed so as to be plane-symmetric with the electrodes 22*b* and 23*b* of the MOSFET 20*b* with respect to the XZ plane.

The light receiving element 30 is a photo diode array (PDA), a phototransistor, or the like. FIGS. 1 and 2 show a case where the light receiving element 30 is a PDA. Hereinafter, a case where the light receiving element 30 is the PDA will be described. The light receiving element 30 is provided above the MOSFET 20*a* and the MOSFET 20*b*. A light receiving surface is provided on a bottom surface of the light receiving element 30. In other words, the light receiving surface of the light receiving element 30 faces the downward side, on which the MOSFET 20*a* and the MOSFET 20*b* are disposed.

The light receiving element 30 includes electrodes 31, 32, 33, and 34. The electrodes 31, 32, 33, and 34 are provided on the bottom surface of the light receiving element 30. For example, the electrodes 31 and 33 are electrically coupled by interconnects (not illustrated) provided in the light receiving element 30. For example, the electrodes 32 and 34 are electrically coupled by interconnects (not illustrated) provided in the light receiving element 30. For example, the electrodes 31, 32, 33, and 34 are bump electrodes. The electrode 31 is coupled to the electrode 22*a* of the MOSFET 20*a* via the interconnect 91. The electrode 32 is coupled to the electrode 23*a* of the MOSFET 20*a* via the interconnect 92. The electrode 33 is coupled to the electrode 22*b* of the MOSFET 20*b* via the interconnect 93. The electrode 34 is coupled to the electrode 23*b* of the MOSFET 20*b* via the interconnect 94.

The light emitting element 50 is, for example, a light emitting diode (LED). The light emitting element 50 is provided on the bottom surface of the light receiving element 30 with the adhesive layer 40 interposed therebetween. That is, the light emitting element 50 is disposed between the MOSFETs 20*a* and 20*b* and the light receiving element 30. Note that an insulating material having a light transmitting property is used for the adhesive layer 40. A light emitting surface is provided on a top surface of the light emitting element 50. The light emitting surface of the light emitting element 50 faces the light receiving surface of the light receiving element 30.

The light emitting element 50 includes electrodes 51 and 52. The electrodes 51 and 52 are provided on a bottom surface of the light emitting element 50. One of the electrodes 51 and 52 is an anode electrode of the light emitting element 50, and the other is a cathode electrode of the light emitting element 50. The electrode 51 is coupled to the electrode 62 via the interconnects 95 and 97. The electrode 52 is coupled to the electrode 63 via the interconnects 96 and 98.

The electrodes 60 and 61 are provided, for example, on the bottom surfaces of the MOSFETs 20*a* and 20*b*, respectively. The electrode 60 and the electrode 61 are disposed in the Y direction. The electrode 60 is electrically coupled to the electrode 21*a* of the MOSFET 20*a*. The electrode 61 is electrically coupled to the electrode 21*b* of the MOSFET 20*b*.

The electrodes 62 and 63 are disposed, for example, at substantially the same positions as the electrodes 60 and 61 in the Z direction so as to be aligned with the electrodes 60 and 61 in the X direction. The electrodes 62 and 63 are disposed in the Y direction.

The input terminals 80 and 81 are provided below the electrodes 62 and 63, respectively. The input terminal 80 is coupled to the electrode 62 via a conductor (not illustrated). The input terminal 81 is coupled to the electrode 63 via a conductor (not illustrated). The input terminals 80 and 81 are coupled to a power supply (not illustrated) provided outside. Note that the power supply is an AC power supply or a DC power supply. A voltage for controlling the photo relay device 1 is applied to the input terminals 80 and 81.

The output terminals 82*a* and 82*b* are provided below the electrodes 60 and 61, respectively. The output terminal 82*a* is coupled to the electrode 60 via a conductor (not illustrated). The output terminal 82*b* is coupled to the electrode 61 via a conductor (not illustrated). The output terminals 82*a* and 82*b* are coupled to circuits or the like (not illustrated) provided outside. As a result, an AC or DC signal is transmitted from the power supply to the circuit via the photo relay device 1.

Figure 3:
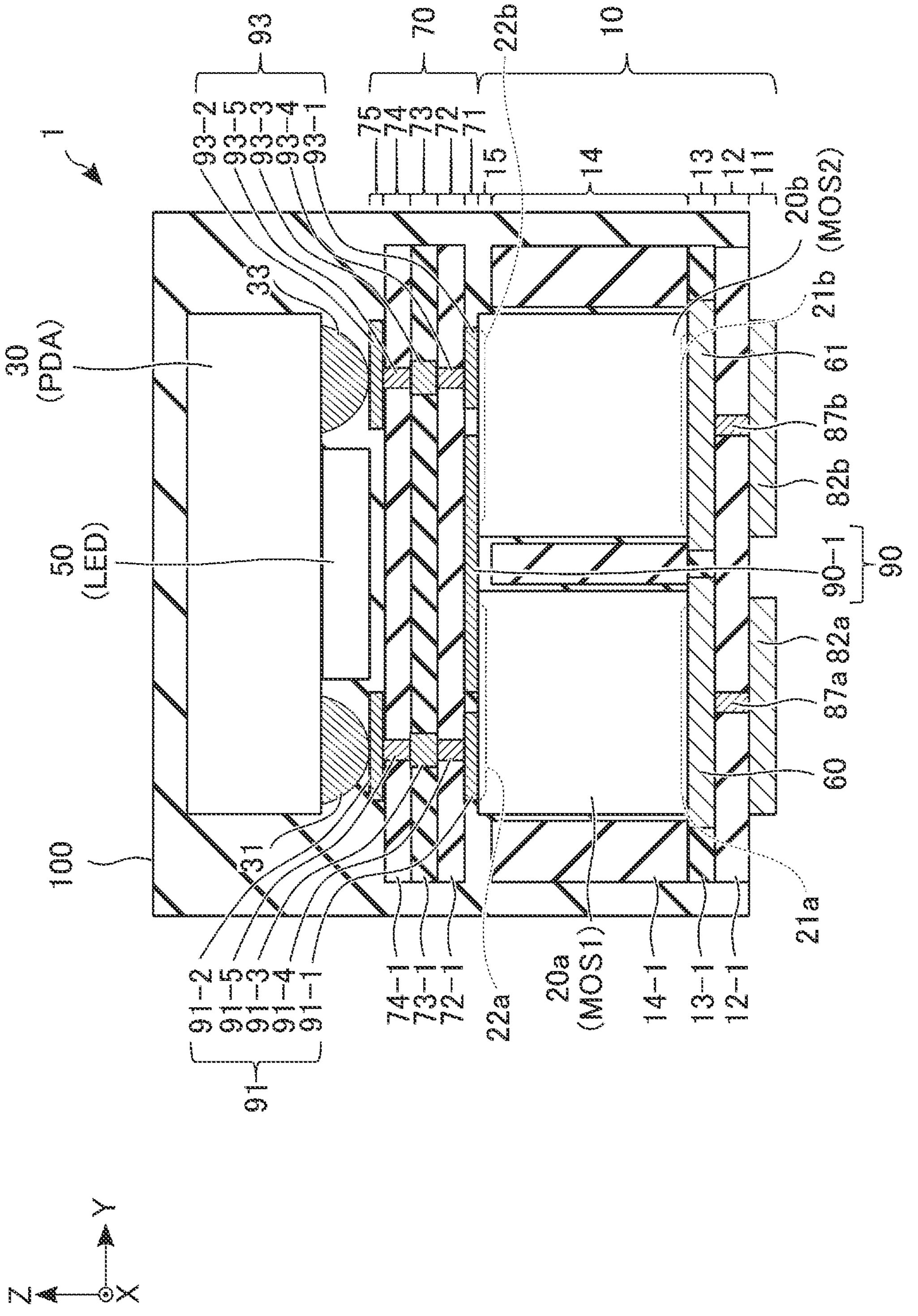
FIG. 3 is a cross-sectional view taken along the line III-III of FIG. 2, showing a cross-sectional structure of the photo relay device according to the first embodiment.
Figure 4:
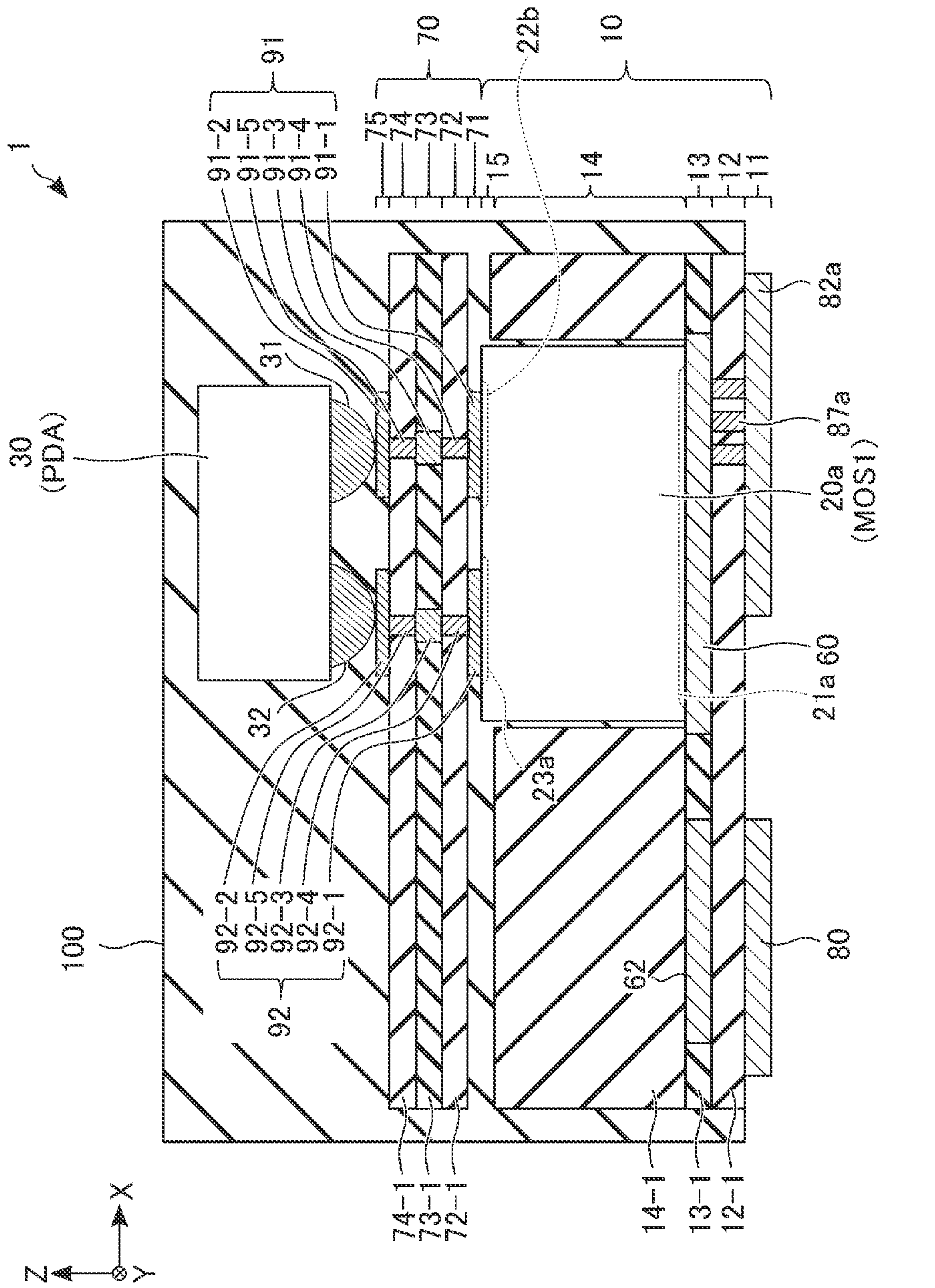
FIG. 4 is a cross-sectional view taken along the line IV-IV of FIG. 2, showing a cross-sectional structure of the photo relay device according to the first embodiment.
Figure 5:
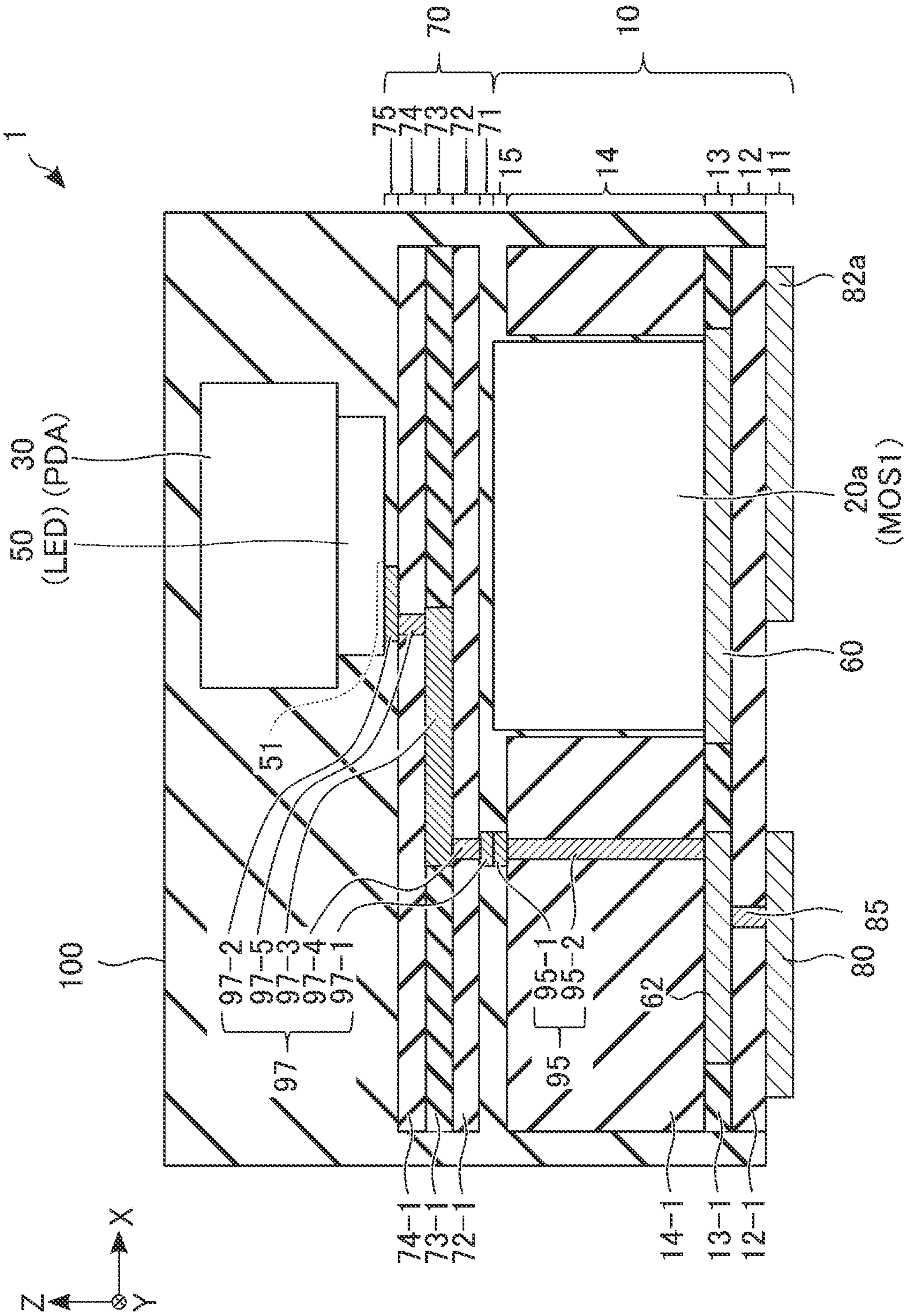
FIG. 5 is a cross-sectional view taken along the line V-V of FIG. 2, showing a cross-sectional structure of the photo relay device according to the first embodiment.

FIG. 3 is a cross-sectional view taken along the line III-III of FIG. 2, showing a cross-sectional structure of the photo relay device according to the first embodiment. FIG. 4 is a cross-sectional view taken along the line IV-IV of FIG. 2, showing a cross-sectional structure of the photo relay device according to the first embodiment. FIG. 5 is a cross-sectional view taken along the line V-V of FIG. 2, showing a cross-sectional structure of the photo relay device according to the first embodiment. FIG. 3 corresponds to a YZ cross section of a portion including the interconnects 90, 91, and 93 of the photo relay device 1. FIG. 4 corresponds to an XZ cross section of a portion including the interconnects 91 and 92 of the photo relay device 1. FIG. 5 corresponds to an XZ cross section of a portion including the interconnect 95 of the photo relay device 1.

First, the overall structure of the photo relay device 1 will be described with reference to FIGS. 3, 4, and 5.

As illustrated in FIGS. 3, 4, and 5, the photo relay device 1 further includes a substrate 10, an intermediate substrate 70, and a sealing resin 100.

The substrate 10 is, for example, a flexible printed circuit (FPC) using polyimide, a resin substrate, or a polyimide substrate. The substrate 10 includes interconnect layers 11, 13, and 15 and insulator layers 12 and 14. The substrate 10 includes, for example, a five-layer structure in which the interconnect layer 11, the insulator layer 12, the interconnect layer 13, the insulator layer 14, and the interconnect layer 15 are stacked sequentially in the upward direction. The substrate 10 has an opening that is a hole penetrating the interconnect layer 15 and the insulator layer 14 and reaching the interconnect layer 13. The MOSFETs 20*a* and 20*b* are disposed in the opening of the substrate 10. That is, the MOSFETs 20*a* and 20*b* are provided at positions intersecting the substrate 10 on the XY plane. An upper portion of the substrate 10 is in contact with a lower portion of the intermediate substrate 70.

The intermediate substrate 70 is, for example, a resin substrate, a polyimide substrate, or a silicon substrate. The intermediate substrate 70 includes interconnect layers 71, 73, and 75 and insulator layers 72 and 74. The intermediate substrate 70 includes, for example, a five-layer structure in which the interconnect layer 71, the insulator layer 72, the interconnect layer 73, the insulator layer 74, and the interconnect layer 75 are stacked sequentially in the upward direction. The interconnect layer 71 of the intermediate substrate 70 is in contact with the interconnect layer 15 of the substrate 10 and the upper portion of each of the MOSFETs 20*a* and 20*b*. The interconnect layer 75 of the intermediate substrate 70 is in contact with the lower portion of each of the light receiving element 30 and the light emitting element 50. Therefore, the substrate 10, the MOSFETs 20*a* and 20*b*, the intermediate substrate 70, the light emitting element 50, and the light receiving element 30 are disposed sequentially in the Z direction.

The sealing resin 100 is, for example, a mold resin having a light shielding property. The sealing resin 100 covers the MOSFETs 20*a* and 20*b*, the light receiving element 30, the light emitting element 50, and the intermediate substrate 70 to protect them from physical or electrical disturbance.

Next, a configuration for electrically coupling the MOSFETs 20*a* and 20*b* and the output terminals 82*a* and 82*b* will be described with reference to FIGS. 3 and 4.

The interconnect layer 11 includes output terminals 82*a* and 82*b*. The insulator layer 12 includes conductors 87*a* and 87*b* and an insulator 12-1. The interconnect layer 13 includes electrodes 60 and 61 and an insulator 13-1.

The electrode 60 is in contact with the electrode 21*a* of the MOSFET 20*a*. The electrode 61 is in contact with the electrode 21*b* of the MOSFET 20*b*. The insulator 13-1 insulates the electrode 60 and the electrode 61 from each other. The conductor 87*a* functions as a via extending in the Z direction in the insulator 12-1 so as to couple a top surface of the output terminal 82*a* and a bottom surface of the electrode 60. The conductor 87*b* functions as a via extending in the Z direction in the insulator 12-1 so as to couple a top surface of the output terminal 82*b* and a bottom surface of the electrode 61. Note that, in the example of FIG. 4, three conductors 87*a* are provided, but one or more conductors 87*a* may be provided. The same applies to the conductor 87*b*.

With the above configuration, the MOSFETs 20*a* and 20*b* are electrically coupled to the output terminals 82*a* and 82*b*.

Next, a configuration for electrically coupling the MOSFETs 20*a* and 20*b* and the light receiving element 30 will be described with reference to FIGS. 3 and 4.

The interconnect layer 71 includes electrodes 90-1, 91-1, 92-1, and 93-1. The insulator layer 72 includes conductors 91-4, 92-4, and 93-4 and an insulator 72-1. The interconnect layer 73 includes an insulator 73-1 and conductors 91-3, 92-3, and 93-3. The insulator layer 74 includes conductors 91-5, 92-5, and 93-5 and an insulator 74-1. The interconnect layer 75 includes electrodes 91-2, 92-2, and 93-2.

The electrodes 90-1, 91-1, 91-2, 92-1, 92-2, 93-1, and 93-2 are, for example, silver or gold conductive paste materials. The electrodes 90-1, 91-1, 92-1, and 93-1 are not in contact with each other in the interconnect layer 71 and are not electrically coupled. The electrodes 91-2, 92-2, and 93-2 are not in contact with each other in the interconnect layer 75 and are not electrically coupled.

The electrode 90-1 corresponds to the interconnect 90. The configuration corresponding to the interconnect 90 electrically couples the electrode 22*a* of the MOSFET 20*a* and the electrode 22*b* of the MOSFET 20*b*.

The electrodes 91-1 and 91-2 and the conductors 91-3, 91-4, and 91-5 correspond to the interconnect 91. The configuration corresponding to the interconnect 91 electrically couples the electrode 31 of the light receiving element 30 and the electrode 22*a* of the MOSFET 20*a*.

The electrodes 92-1 and 92-2 and the conductors 92-3, 92-4, and 92-5 correspond to the interconnect 92. The configuration corresponding to the interconnect 92 electrically couples the electrode 32 of the light receiving element 30 and the electrode 23*a* of the MOSFET 20*a*.

The electrodes 93-1 and 93-2 and the conductors 93-3, 93-4, and 93-5 correspond to the interconnect 93. The configuration corresponding to the interconnect 93 electrically couples the electrode 33 of the light receiving element 30 and the electrode 22*b* of the MOSFET 20*b*.

The electrode 90-1 extends in the Y direction so that both ends thereof are in contact with the top surface of the electrode 22*a* of the MOSFET 20*a* and the top surface of the electrode 22*b* of the MOSFET 20*b*.

The electrode 91-1 is in contact with the top surface of the electrode 22*a* of the MOSFET 20*a*. The electrode 91-2 is in contact with the bottom surface of the electrode 31. The conductor 91-3 has, for example, a function of adjusting position shift between the electrode 22*a* and the electrode 31 viewed in the Z direction. The conductor 91-4 functions as a via extending in the Z direction in the insulator 72-1 so as to couple the top surface of the electrode 91-1 and the bottom surface of the conductor 91-3. The conductor 91-5 functions as a via extending in the Z direction in the insulator 74-1 so as to couple the top surface of the conductor 91-3 and the bottom surface of the electrode 91-2.

The electrode 92-1 is in contact with the top surface of the electrode 23*a* of the MOSFET 20*a*. The electrode 92-2 is in contact with the bottom surface of the electrode 32. The conductor 92-3 has, for example, a function of adjusting position shift between the electrode 23*a* and the electrode 32 viewed in the Z direction. The conductor 92-4 functions as a via extending in the Z direction in the insulator 72-1 so as to couple the top surface of the electrode 92-1 and the bottom surface of the conductor 92-3. The conductor 92-5 functions as a via extending in the Z direction in the insulator 74-1 so as to couple the top surface of the conductor 92-3 and the bottom surface of the electrode 92-2.

The electrode 93-1 is in contact with the top surface of the electrode 22*b* of the MOSFET 20*b*. The electrode 93-2 is in contact with the bottom surface of the electrode 33. The conductor 93-3 has, for example, a function of adjusting position shift between the electrode 22*b* and the electrode 33 viewed in the Z direction. The conductor 93-4 functions as a via extending in the Z direction in the insulator 72-1 so as to couple the top surface of the electrode 93-1 and the bottom surface of the conductor 93-3. The conductor 93-5 functions as a via extending in the Z direction in the insulator 74-1 so as to couple the top surface of the conductor 93-3 and the bottom surface of the electrode 93-2.

Although not illustrated in FIGS. 3 and 4, the intermediate substrate 70 further includes a configuration corresponding to the interconnect 94. The configuration corresponding to the interconnect 94 electrically couples the electrode 34 of the light receiving element 30 and the electrode 23*b* of the MOSFET 20*b*. The configuration corresponding to the interconnect 94 is similar to the configuration corresponding to the interconnect 92. The insulator 73-1 insulates the conductors 91-3, 92-3, and 93-3 and the conductor corresponding to the conductor 92-3 in the interconnect 94 from each other.

With the above configuration, the MOSFETs 20*a* and 20*b* are electrically coupled to the light receiving element 30.

Next, a configuration for electrically coupling the input terminals 80 and 81 and the light emitting element 50 will be described with reference to FIG. 5.

The interconnect layer 11 further includes an input terminal 80. The insulator layer 12 further includes a conductor 85. The interconnect layer 13 further includes an electrode 62. The insulator layer 14 further includes a conductor 95-2. The interconnect layer 15 further includes an electrode 95-1.

The interconnect layer 71 further includes an electrode 97-1. The insulator layer 72 further includes a conductor 97-4. The interconnect layer 73 further includes a conductor 97-3. The insulator layer 74 further includes a conductor 97-5. The interconnect layer 75 further includes an electrode 97-2.

The electrode 95-1 and the conductor 95-2 correspond to the interconnect 95. The electrodes 97-1 and 97-2 and the conductors 97-3, 97-4, and 97-5 correspond to the interconnect 97. The configuration corresponding to the interconnects 95 and 97 electrically couples the electrode 51 of the light emitting element 50 and the electrode 62.

The conductor 85 functions as a via extending in the Z direction in the insulator 12-1 so as to couple the top surface of the input terminal 80 and the bottom surface of the electrode 62. The conductor 95-2 functions as a via extending in the Z direction in the insulator 14-1 so as to couple the top surface of the electrode 62 and the bottom surface of the electrode 95-1. The electrode 62 is insulated from the electrodes 60 and 61 by the insulator 13-1.

The electrode 97-1 is in contact with the top surface of the electrode 95-1. The electrode 97-2 is in contact with the bottom surface of the electrode 51. The conductor 97-3 has, for example, a function of adjusting position shift between the electrode 95-1 and the electrode 51 viewed in the Z direction. The conductor 97-3 is insulated from the conductors 91-3, 92-3, and 93-3 and the conductor corresponding to the conductor 92-3 in the interconnect 94 by the insulator 73-1. The conductor 97-4 functions as a via extending in the Z direction in the insulator 72-1 so as to couple the top surface of the electrode 97-1 and the bottom surface of the conductor 97-3. The conductor 97-5 functions as a via extending in the Z direction in the insulator 74-1 so as to couple the top surface of the conductor 97-3 and the bottom surface of the electrode 97-2.

Although not illustrated in FIG. 5, the interconnect layer 11 further includes an input terminal 81. The insulator layer 12 further includes a conductor that electrically couples the electrode 63 and the input terminal 81. The interconnect layer 13 further includes an electrode 63. The insulator layer 14 and the interconnect layer 15 further include a configuration corresponding to the interconnect 96. The intermediate substrate 70 further includes a configuration corresponding to the interconnect 98. The electrode 63 is insulated from the electrodes 60, 61, and 62 by the insulator 13-1. The conductor electrically coupling the electrode 63 and the input terminal 81 is equivalent to the configuration corresponding to the conductor 85. The configuration corresponding to the interconnect 96 is equivalent to the configuration corresponding to the interconnect 95. The configuration corresponding to the interconnect 98 is equivalent to the configuration corresponding to the interconnect 97. In the interconnect 98, the conductor corresponding to the conductor 97-3 and the conductor 97-3 are insulated by the insulator 73-1. The configuration corresponding to the interconnects 96 and 98 electrically couples the electrode 52 of the light emitting element 50 and the electrode 63.

With the above configuration, the input terminals 80 and 81 are electrically coupled to the light emitting element 50.

Figure 6:
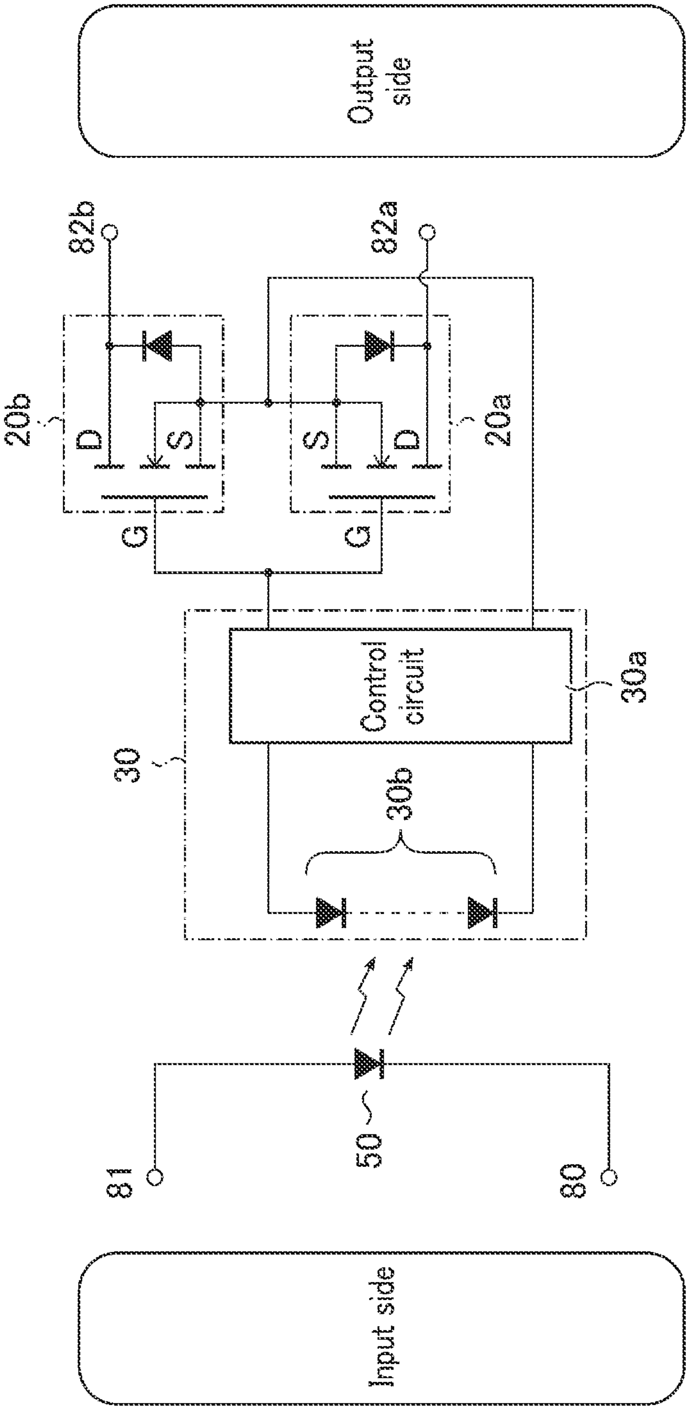
FIG. 6 is a circuit diagram of a circuit configuration of the photo relay device according to the first embodiment.

FIG. 6 is a circuit diagram illustrating an example of a circuit configuration of the photo relay device according to the first embodiment. An example of a circuit configuration of the photo relay device 1 according to the first embodiment will be described with reference to FIG. 6.

As illustrated in FIG. 6, the light emitting element 50 is coupled to the input terminals 80 and 81. An input voltage for controlling the photo relay device 1 is applied to the input terminals 80 and 81.

The light receiving element 30 is, for example, a photo diode array including a control circuit 30*a* and several to several tens of photodiodes 30*b* coupled in series. Both ends of the photodiodes 30*b* coupled in series are coupled to the control circuit 30*a*.

The gates of the MOSFETs 20*a* and 20*b* are commonly coupled to the anode of the light receiving element 30. The sources of the MOSFETs 20*a* and 20*b* are commonly coupled to the cathode of the light receiving element 30. The drain of the MOSFET 20*a* is coupled to the output terminal 82*a*. The drain of the MOSFET 20*b* is coupled to the output terminal 82*b*.

In a case where the input-side light emitting element 50 is turned on (lit state), the light receiving element 30 that drives the MOSFETs 20*a* and 20*b* receives light from the light emitting element 50 and generates a voltage of, for example, 7 V to several ten V. As a result, the MOSFETs 20*a* and 20*b* are turned on, and the output terminals 82*a* and 82*b* are electrically coupled. Further, in a case where the light emitting element 50 is turned off (unlit state), the MOSFETs 20*a* and 20*b* are turned off, and the output terminals 82*a* and 82*b* are electrically decoupled.

Next, an example of a method for manufacturing the photo relay device according to the first embodiment will be described. FIGS. 7, 8, 9, and 10 are cross-sectional views of a cross-sectional structure in a manufacturing process of the photo relay device according to the first embodiment. The cross sections illustrated in FIGS. 7, 8, 9, and 10 correspond to the cross section illustrated in FIG. 3.

First, the substrate 10 without an opening, the MOSFETs 20*a* and 20*b*, the light receiving element 30, the light emitting element 50, and the intermediate substrate 70 are individually formed. The light receiving element 30 and the light emitting element 50 are bonded via the adhesive layer 40 such that the light receiving surface and the light emitting surface face each other.

Figure 7:
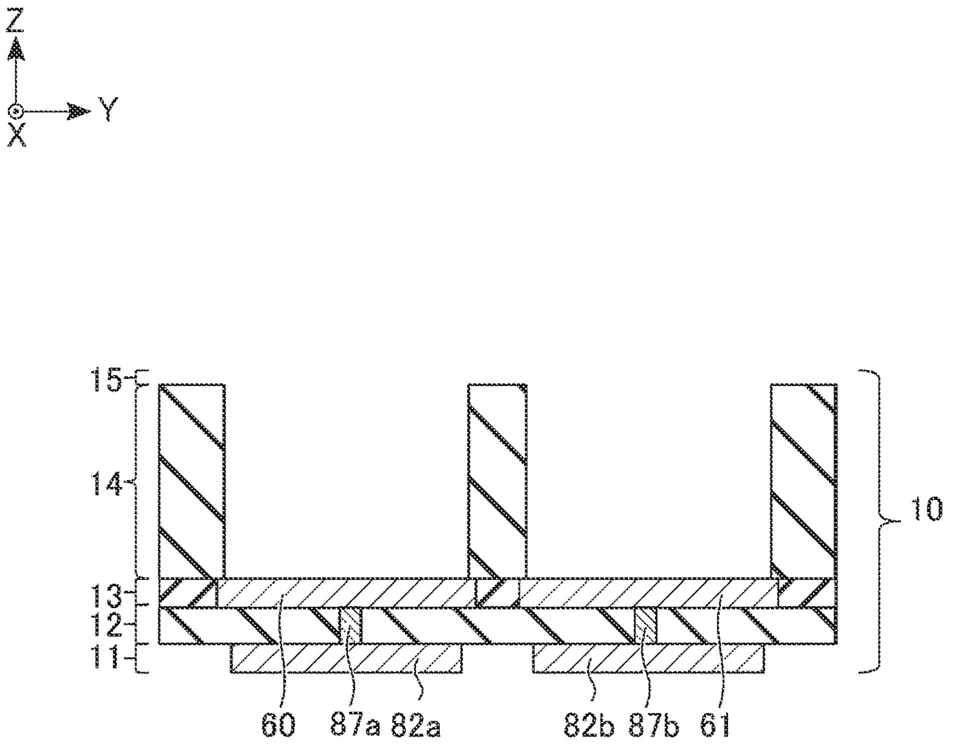
FIG. 7 is a cross-sectional view of a cross-sectional structure in a manufacturing process of the photo relay device according to the first embodiment.

Next, as illustrated in FIG. 7, an opening is formed in the substrate 10 by, for example, laser processing. The electrodes 60 and 61 are exposed by the laser processing.

Figure 8:
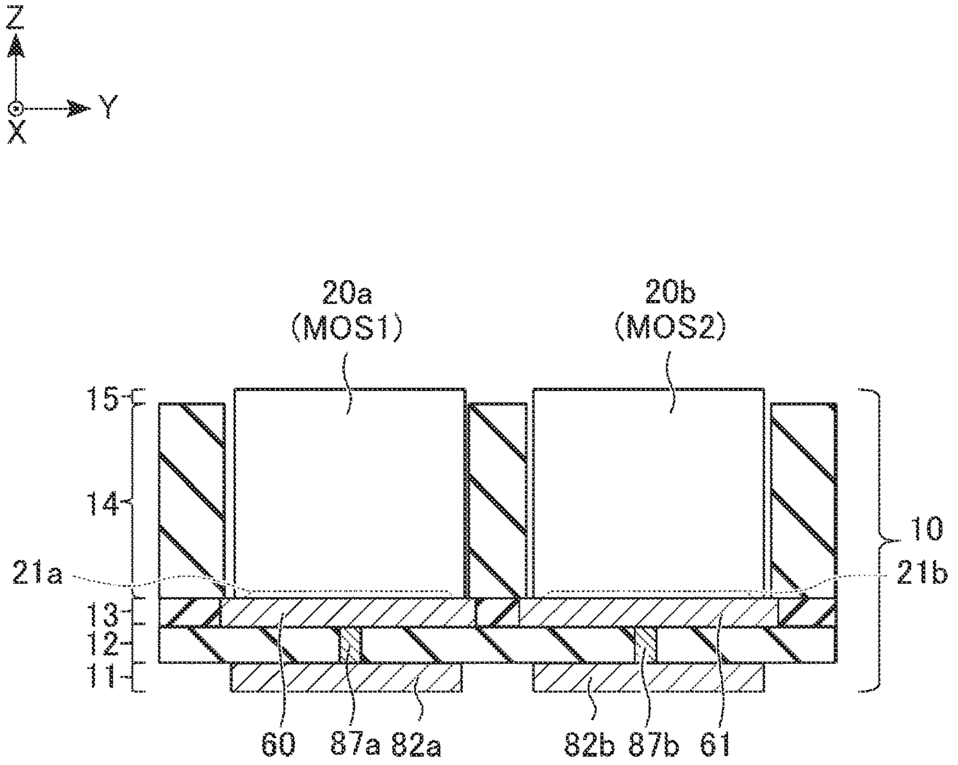
FIG. 8 is a cross-sectional view of a cross-sectional structure in a manufacturing process of the photo relay device according to the first embodiment.

Next, as illustrated in FIG. 8, the electrode 21*a* of the MOSFET 20*a* is bonded to the top surface of the electrode 60, and the electrode 21*b* of the MOSFET 20*b* is bonded to the top surface of the electrode 61. As a result, the MOSFETs 20*a* and 20*b* are supported by the substrate 10.

Figure 9:
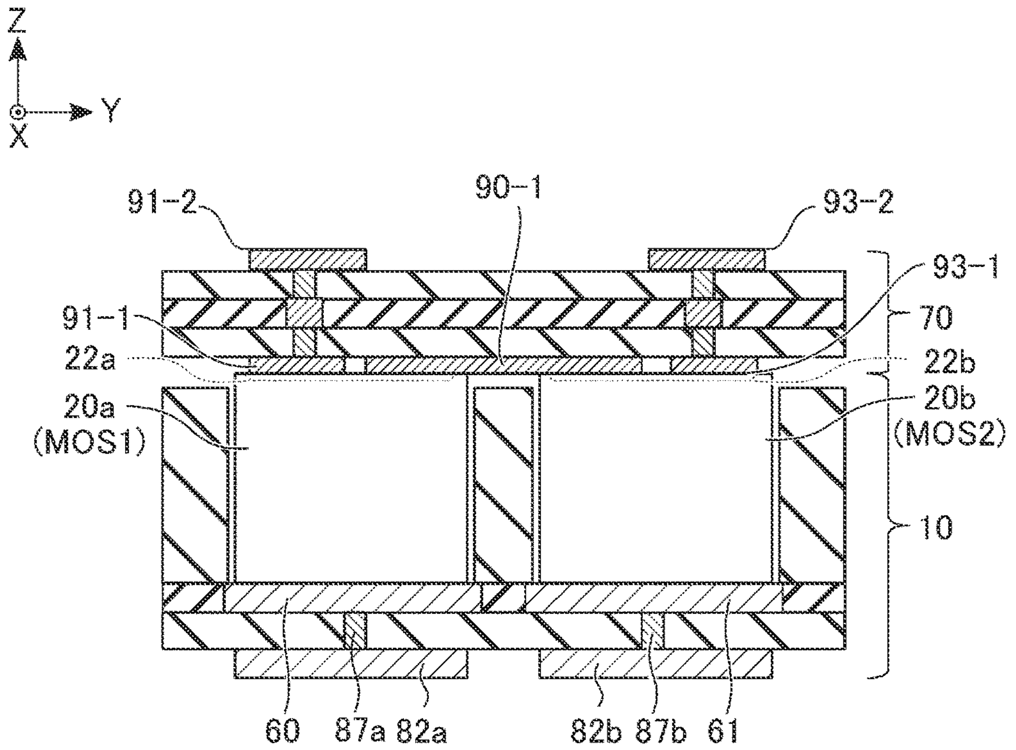
FIG. 9 is a cross-sectional view of a cross-sectional structure in a manufacturing process of the photo relay device according to the first embodiment.

Next, as illustrated in FIG. 9, the intermediate substrate 70 is provided on the top surfaces of the substrate 10 and the MOSFETs 20*a* and 20*b*. Specifically, the electrode 22*a* of the MOSFET 20*a* is bonded to the electrodes 90-1 and 91-1 of the intermediate substrate 70. The electrode 22*b* of the MOSFET 20*b* is bonded to the electrodes 90-1 and 93-1 of the intermediate substrate. Although not illustrated in FIG. 9, the electrode 23*a* of the MOSFET 20*a* is bonded to the electrode 92-1 of the intermediate substrate 70. The electrode 23*b* of the MOSFET 20*b* is bonded to the electrode on the bottom surface side corresponding to the interconnect 94 of the intermediate substrate 70. The electrode 95-1 of the substrate 10 is bonded to the electrode 97-1 of the intermediate substrate 70. The electrode corresponding to the interconnect 96 of the substrate 10 is bonded to the electrode on the bottom surface side corresponding to the interconnect 98 of the intermediate substrate 70. As a result, the intermediate substrate 70 is supported by the substrate 10 and the MOSFETs 20*a* and 20*b*.

Figure 10:
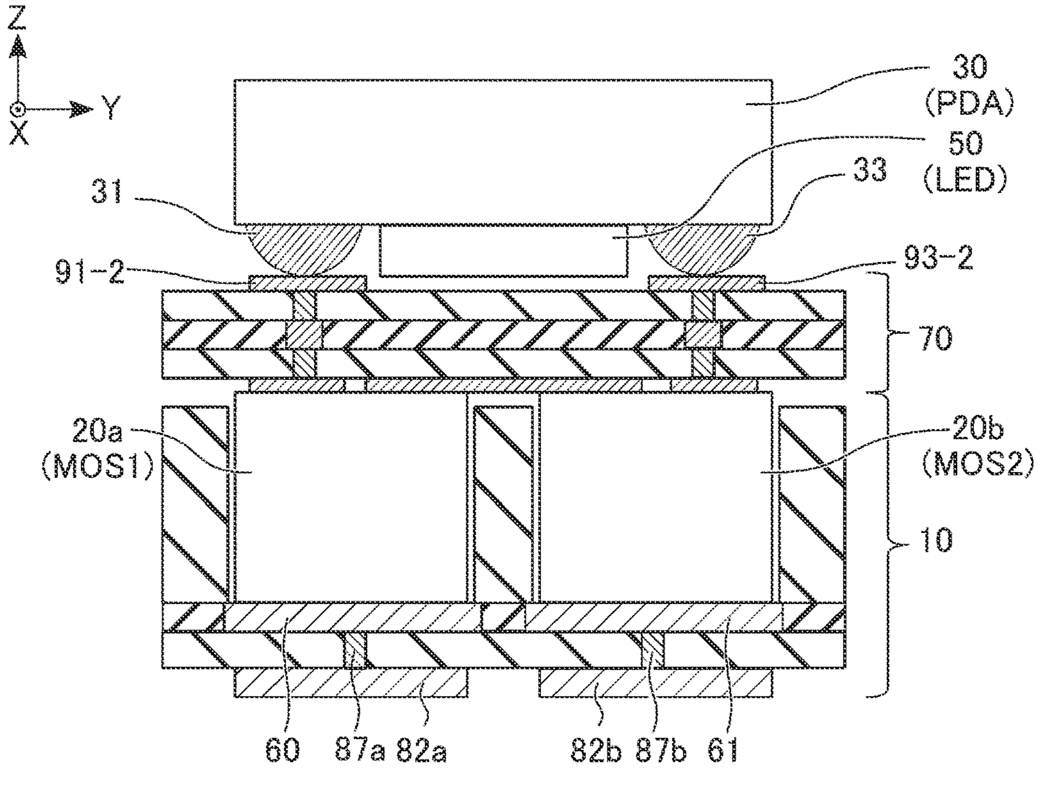
FIG. 10 is a cross-sectional view of a cross-sectional structure in a manufacturing process of the photo relay device according to the first embodiment.

Next, as illustrated in FIG. 10, the light receiving element 30 and the light emitting element 50 bonded by the adhesive layer 40 are provided on the top surface of the intermediate substrate 70. Specifically, the electrode 31 of the light receiving element 30 is bonded to the electrode 91-2 of the intermediate substrate 70, and the electrode 33 of the light receiving element 30 is bonded to the electrode 93-2 of the intermediate substrate 70. Although not illustrated in FIG. 10, the electrode 32 of the light receiving element 30 is bonded to the electrode 92-2 of the intermediate substrate 70, and the electrode 34 of the light receiving element 30 is bonded to the electrode on the top surface side corresponding to the interconnect 94 of the intermediate substrate 70. Further, the electrode 51 of the light emitting element 50 is bonded to the electrode 97-2 of the intermediate substrate 70, and the electrode 52 of the light emitting element 50 is bonded to the electrode on the top surface side corresponding to the interconnect 98 of the intermediate substrate 70.

Finally, a portion excluding the lower portion of the structure is sealed with the sealing resin 100. In this way, the photo relay device 1 is manufactured.

In the photo relay device, the light receiving element and the light emitting element may be disposed between the MOSFET (output terminal) and the electrode (input terminal). In this case, coupling capacitances are generated between the light receiving element and the input terminal and between the light receiving element and the output terminal. Due to the influence of these coupling capacitances, high-frequency transmission characteristics of, for example, 1 GHz or more may be deteriorated. In addition, for example, in a case where the length of the interconnect coupling the light receiving element and the MOSFET increases, transmission characteristics are deteriorated in a lower frequency region due to the influence of an open stub.

According to the configuration of the first embodiment, the light receiving element 30 and the light emitting element 50 are disposed above the MOSFET 20*a* and the MOSFET 20*b*. As a result, the coupling capacitances generated between the light receiving element 30 and the input terminals 80 and 81 and between the light receiving element 30 and the output terminals 82*a* and 82*b* can be reduced. In addition, by disposing the light receiving element 30 and the light emitting element 50 above the MOSFET 20*a* and the MOSFET 20*b*, the length of the interconnect coupling the electrode of the light receiving element 30 and the electrodes of the MOSFET 20*a* and the MOSFET 20*b* can be relatively shortened. Similarly, the length of the interconnect coupling the electrode of the light emitting element 50 and the input terminal provided on the lower layer surface of the substrate 10 can be relatively shortened. Therefore, the influence of an open stub can be shifted to a higher frequency region. Therefore, the transmission characteristics of the high-frequency signal of the semiconductor device can be improved.

Further, according to the configuration of the first embodiment, by disposing the light receiving element 30 and the light emitting element 50 above the MOSFET 20*a* and the MOSFET 20*b*, the installation area of the photo relay device 1 can be reduced. That is, the photo relay device 1 can be downsized.

In addition, by using the multilayer substrate as the intermediate substrate 70, it is possible to adjust the position shift between the electrodes 22*a* and 23*a* of the MOSFET 20*a* and the electrodes 22*b* and 23*b* of the MOSFET 20*b*, and the electrodes 31, 32, 33, and 34 of the light receiving element 30 in a case of being viewed in the Z direction. Similarly, it is possible to adjust the position shift between the electrodes 51 and 52 of the light emitting element 50 and the electrodes of the input terminals 80 and 81 in a case of being viewed in the Z direction. That is, it is possible to reduce the possibility of malfunction due to the position shift of the electrodes at the time of manufacturing.

The MOSFETs 20*a* and 20*b* are disposed in the opening of the substrate 10. That is, the MOSFETs 20*a* and 20*b* are disposed at the positions intersecting the substrate 10 on the XY plane. As a result, the position of the top surface of the region of the substrate 10 where the MOSFETs 20*a* and 20*b* are not provided and the positions of the top surfaces of the MOSFETs 20*a* and 20*b* can be aligned in the Z direction. Therefore, the loads of the light receiving element 30, the light emitting element 50, and the intermediate substrate 70 can be distributed to the substrate 10 and the MOSFETs 20*a* and 20*b*. Therefore, it is possible to reduce the manufacturing load in realizing the structure in which the light receiving element 30 and the light emitting element 50 are disposed above the MOSFETs 20*a* and 20*b*.

Next, a second embodiment will be described. Hereinafter, a configuration and a manufacturing method different from those of the first embodiment will be mainly described.

Figure 11:
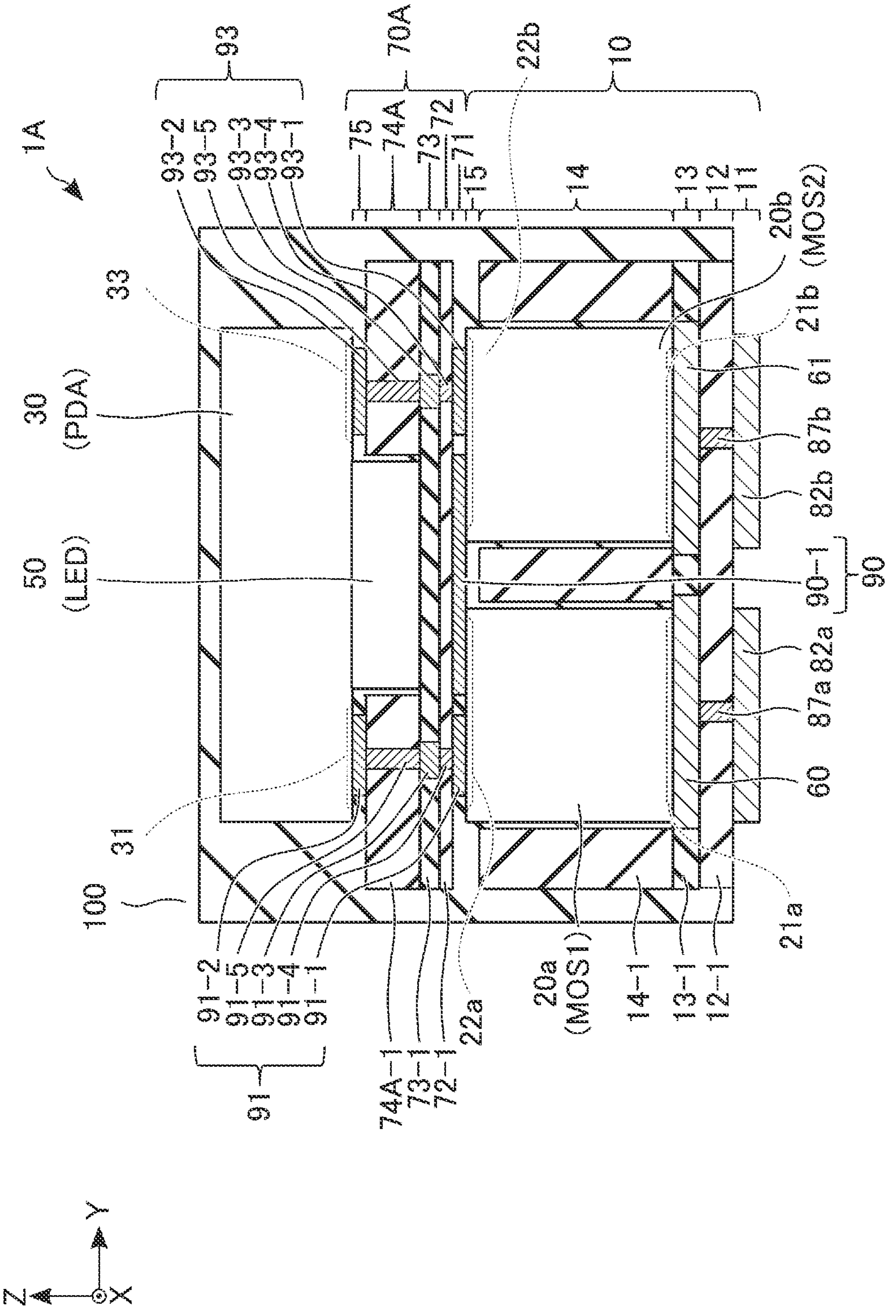
FIG. 11 is a cross-sectional view of a cross-sectional structure of a photo relay device according to a second embodiment.
Figure 12:
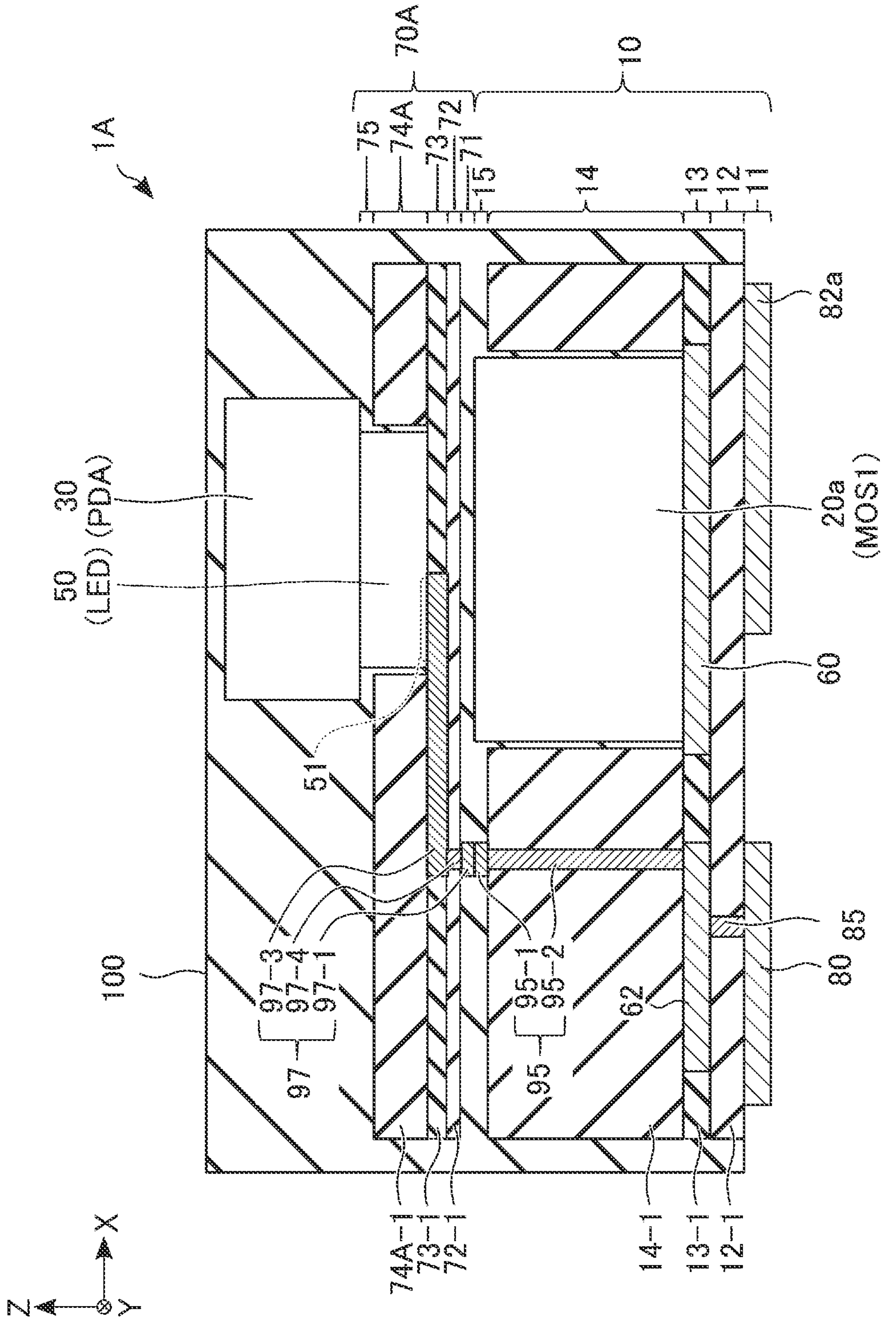
FIG. 12 is a cross-sectional view of a cross-sectional structure of the photo relay device according to the second embodiment.

FIGS. 11 and 12 are cross-sectional views of a cross-sectional structure of a photo relay device according to the second embodiment. FIG. 11 corresponds to FIG. 3 in the first embodiment. FIG. 12 corresponds to FIG. 5 in the first embodiment.

As illustrated in FIGS. 11 and 12, a photo relay device 1A includes an intermediate substrate 70A instead of an intermediate substrate 70 in the first embodiment.

The intermediate substrate 70A includes an insulator layer 74A instead of an insulator layer 74. The insulator layer 74A includes an insulator 74-1A as a base. The intermediate substrate 70A has an opening that is a hole penetrating an interconnect layer 75 and the insulator layer 74A and reaching an interconnect layer 73. A light emitting element 50 is disposed in the opening of the intermediate substrate 70A. That is, the light emitting element 50 in the second embodiment is provided at a position intersecting the intermediate substrate 70A on an XY plane.

Since the opening is provided, the intermediate substrate 70A does not include an electrode 97-2 and a conductor 97-5 as a configuration corresponding to an interconnect 97. In addition, the light emitting element 50 is provided so that an electrode 51 is in contact with a top surface of a conductor 97-3.

Since a light receiving element 30 is provided in the opening, the intermediate substrate 70A and the light receiving element 30 come close to the extent that they can be coupled even with a flat plate electrode. Therefore, electrodes 31, 32, 33, and 34 of the light receiving element 30 may be not bump electrodes but flat plate electrodes.

Although not illustrated in FIGS. 11 and 12, a configuration corresponding to an interconnect 98 is equivalent to the configuration corresponding to the interconnect 97.

With the above configuration, the input terminals 80 and 81 are electrically coupled to the light emitting element 50.

Next, an example of a method for manufacturing the photo relay device according to the second embodiment will be described. FIGS. 13 and 14 are cross-sectional views showing an example of a cross-sectional structure in a manufacturing process of the photo relay device according to the second embodiment. FIG. 13 corresponds to FIG. 9 of the first embodiment. FIG. 14 corresponds to FIG. 10 of the first embodiment.

First, an opening is formed in advance on the intermediate substrate 70A on which no opening is formed, for example, by laser processing. By the laser processing, the conductor 97-3 and the conductor corresponding to the interconnect 98 of the intermediate substrate 70A are exposed. Thereafter, a substrate 10 and MOSFETs 20*a* and 20*b* are provided similarly to the steps described with reference to FIGS. 7 and 8 in the first embodiment.

Subsequently, as illustrated in FIG. 13, the intermediate substrate 70A is provided on top surfaces of the substrate 10 and the MOSFETs 20*a* and 20*b*. A specific bonding relation is similar to that in FIG. 9 of the first embodiment.

Next, as illustrated in FIG. 14, the light receiving element 30 and the light emitting element 50 bonded by an adhesive layer 40 are provided on a top surface of the intermediate substrate 70A. At this time, at least a part of the light emitting element 50 is accommodated in the opening of the intermediate substrate 70A. Specifically, the electrode 51 of the light emitting element 50 is bonded to the conductor 97-3 of the intermediate substrate 70A. Although not illustrated in FIG. 14, an electrode 52 of the light emitting element 50 is bonded to the conductor corresponding to the interconnect 98 of the intermediate substrate 70A. A bonding relation between the light receiving element 30 and the MOSFETs 20*a* and 20*b* is similar to that in FIG. 10 of the first embodiment.

Finally, a portion excluding the lower portion of the structure obtained by the above-described steps is sealed with the sealing resin 100. In this way, the photo relay device 1A is manufactured.

According to the configuration of the second embodiment, the height of the photo relay device can be reduced, so that the photo relay device can be downsized.

According to the configuration of the second embodiment, the light receiving element 30 and the light emitting element 50 are disposed above the MOSFET 20*a* and the MOSFET 20*b*, similarly to the first embodiment. Therefore, transmission characteristics of a high-frequency signal of a semiconductor device can be improved.

Next, a third embodiment will be described. Hereinafter, a configuration and a manufacturing method different from those of the first embodiment will be mainly described.

Figure 15:
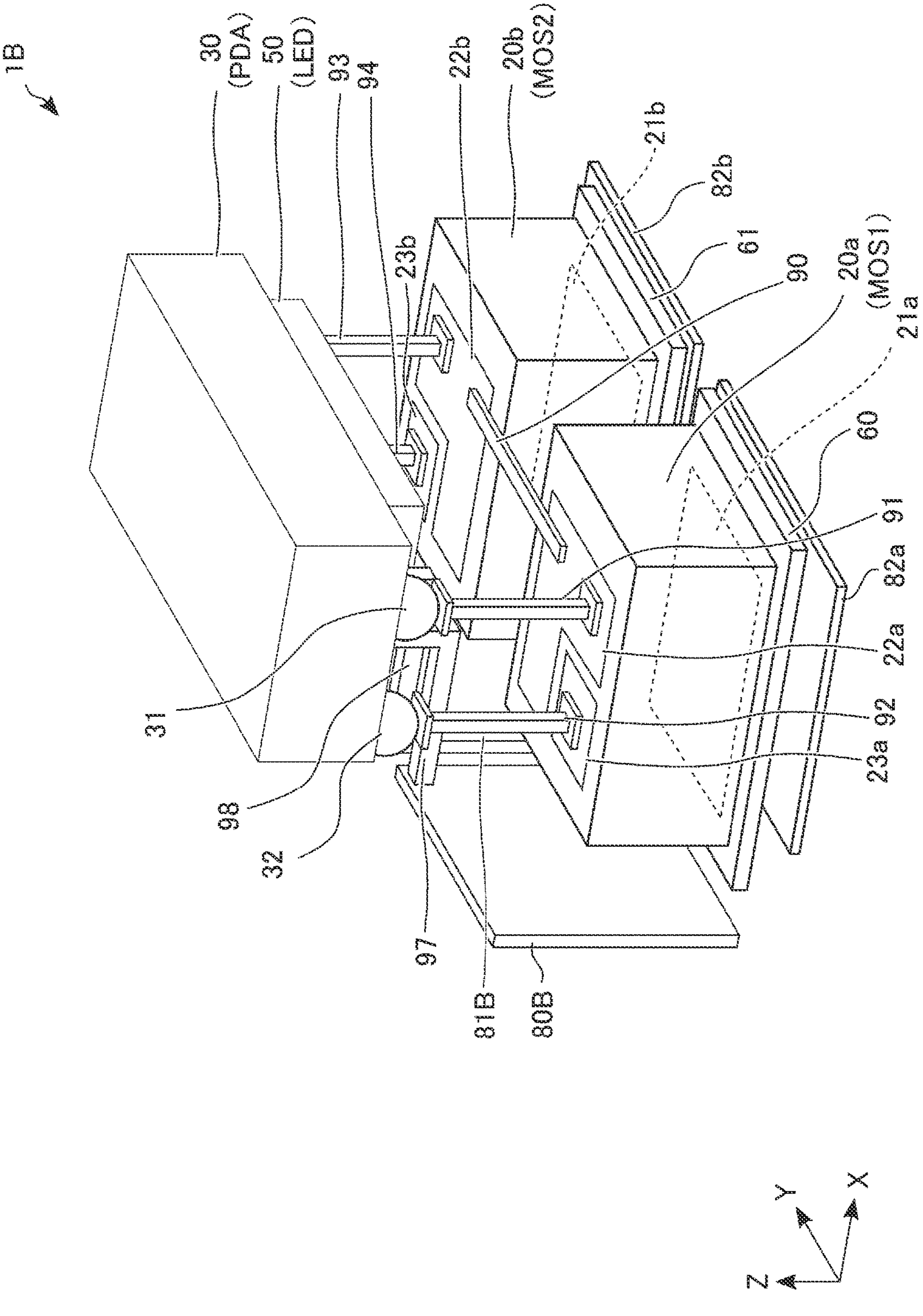
FIG. 15 is a perspective view of an overall configuration of a photo relay device according to a third embodiment.
Figure 16:
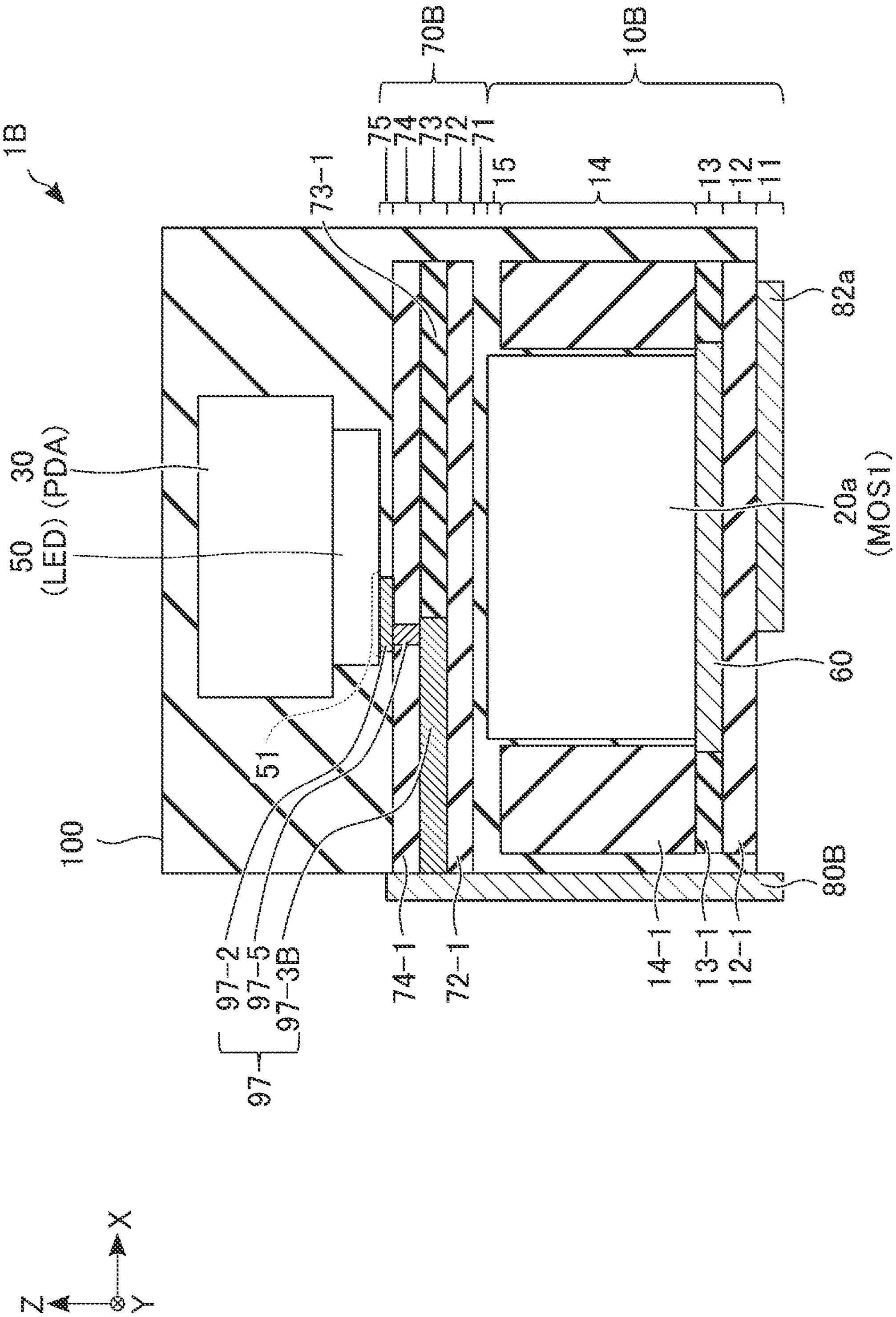
FIG. 16 is a cross-sectional view of a cross-sectional structure of the photo relay device according to the third embodiment.

FIG. 15 is a perspective view of an overall configuration of a photo relay device according to the third embodiment. FIG. 16 is a cross-sectional view of a cross-sectional structure of the photo relay device according to the third embodiment. In FIG. 15, a substrate 10, an intermediate substrate 70, and a sealing resin 100 are omitted in order to clarify an internal structure.

As illustrated in FIGS. 15 and 16, a photo relay device 1B according to the third embodiment includes a substrate 10B instead of the substrate 10 according to the first embodiment. In addition, an intermediate substrate 70B is provided instead of the intermediate substrate 70 in the first embodiment.

The photo relay device 1B includes input terminals 80B and 81B instead of input terminals 80 and 81. Unlike the first embodiment, the input terminals 80B and 81B are not included in the substrate 10B. The input terminals 80B and 81B have, for example, a plate shape extending in a YZ plane, and are provided on an outer side surface of the sealing resin 100 in an X direction. The input terminals 80B and 81B are provided at positions intersecting the substrate 10B and the intermediate substrate 70B on the YZ plane.

The intermediate substrate 70B extends in the X direction and is in contact with the input terminal 80B. The intermediate substrate 70B includes a conductor 97-3B instead of a conductor 97-3. The conductor 97-3B is included in an interconnect layer 73. The conductor 97-3B extends to an end in the X direction of the intermediate substrate 70B and is electrically coupled to the input terminal 80B.

Since the intermediate substrate 70B is in contact with the input terminal 80B, the substrate 10B does not include an electrode 62, a conductor 85, and an interconnect 95. In addition, the intermediate substrate 70B does not include an electrode 97-1 and a conductor 97-4 as a configuration corresponding to an interconnect 97. The input terminal 80B is coupled to an electrode 51 of a light emitting element 50 through the interconnect 97.

Although not illustrated in FIG. 16, a configuration corresponding to an interconnect 98 is equivalent to the configuration corresponding to the interconnect 97.

With the above configuration, the input terminals 80B and 81B are electrically coupled to the light emitting element 50.

As a method for manufacturing the input terminals 80B and 81B, for example, there is a method for providing an electrode on the surface of the sealing resin 100 using molded interconnect device (MID) technology. By using the MID technology, the input terminals 80B and 81B can be disposed on the outer surface of the sealing resin 100.

According to the configuration of the present embodiment, the length of the interconnect coupling the input terminal and the light emitting element can be further shortened. As a result, the influence of an open stub can be shifted to a higher frequency region. Therefore, transmission characteristics of a high-frequency signal of a semiconductor device can be further improved.

Further, according to the configuration of the present embodiment, an installation area of the photo relay device can be further reduced. That is, the photo relay device can be downsized.

As a modification of the photo relay device 1B according to the third embodiment described above, a photo relay device in which the light emitting element 50 is accommodated in the opening of the intermediate substrate 70A as in the second embodiment can be considered. In the present modification, the height of the photo relay device can be suppressed.

In addition to the embodiments described above, examples of embodiments to be conceivable are illustrated. For example, a medium electrically coupling the MOSFET and the light receiving element is not limited to the intermediate substrate. An electrical connection relation similar to those of the embodiments described above may be constructed using conductive interconnects. For example, a method for supporting the light receiving element and the light emitting element is not limited to the support from below. The light receiving element and the light emitting element may be supported from above using a support base or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:

a first substrate;

a first transistor provided on the first substrate;

a light receiving element; and a light emitting element provided on the light receiving element, wherein the first substrate, the first transistor, the light emitting element, and the light receiving element are disposed sequentially in a first direction.

2. The semiconductor device according to claim 1, further comprising:

a second substrate provided between the first substrate and the first transistor, and the light receiving element and the light emitting element.

3. The semiconductor device according to claim 2, further comprising:

a first interconnect configured to electrically couple a gate of the first transistor and a first electrode of the light receiving element; and a second interconnect configured to electrically couple a source of the first transistor and a second electrode of the light receiving element, wherein the first interconnect and the second interconnect are provided on the surface and inside of the second substrate so as to pass through the second substrate in the first direction.

4. The semiconductor device according to claim 3, wherein the first electrode and the second electrode of the light receiving element are bump electrodes.

5. The semiconductor device according to claim 2, further comprising:

an input terminal; and a third interconnect configured to electrically couple the input terminal and a third electrode of the light emitting element, wherein the third interconnect includes a first portion provided on the surface and inside of the second substrate.

6. The semiconductor device according to claim 5, wherein the third interconnect further includes a second portion provided on the surface and inside of the first substrate, the first portion of the third interconnect is provided so as to pass through the second substrate in the first direction, the second portion of the third interconnect is provided so as to pass through the first substrate in the first direction, and the input terminal is provided on the first substrate.

7. The semiconductor device according to claim 5, wherein the input terminal is disposed side by side with each of the first substrate, the second substrate, the first transistor, the light receiving element, and the light emitting element in a second direction intersecting the first direction, and is disposed so as to intersect the first substrate and the second substrate.

8. The semiconductor device according to claim 7, wherein the input terminal is in contact with a side surface of the second substrate, and the first portion of the third interconnect extends in the second direction in the second substrate and is in contact with the input terminal on the side surface of the second substrate.

9. The semiconductor device according to claim 1, further comprising:

a first output terminal provided on the first substrate; and a fourth interconnect configured to electrically couple the first output terminal and a drain of the first transistor, wherein the fourth interconnect is provided on the surface and inside of the first substrate so as to pass through the first substrate in the first direction.

10. The semiconductor device according to claim 1, wherein the first transistor is provided at a position intersecting the first substrate in a second direction intersecting the first direction.

11. The semiconductor device according to claim 2, wherein the light emitting element is provided at a position intersecting the second substrate in a second direction intersecting the first direction.

12. The semiconductor device according to claim 1, further comprising:

a second transistor provided on the first substrate, wherein the first substrate, the second transistor, the light emitting element, and the light receiving element are disposed sequentially in the first direction, and a source of the first transistor and a source of the second transistor are electrically coupled to each other.

13. The semiconductor device according to claim 12, further comprising:

a second substrate provided between the first substrate, the first transistor, and the second transistor and the light receiving element and the light emitting element.

14. The semiconductor device according to claim 13, further comprising:

a fifth interconnect configured to electrically couple the source of the first transistor and the source of the second transistor;

a first interconnect configured to electrically couple a gate of the first transistor and a first electrode of the light receiving element;

a sixth interconnect configured to electrically couple a gate of the second transistor and a third electrode of the light receiving element; and a second interconnect configured to electrically couple the source of the first transistor and the source of the second transistor, and a second electrode of the light receiving element, wherein the first transistor and the second transistor are provided side by side in a third direction intersecting the first direction, the fifth interconnect is provided so as to extend in the third direction on a surface of the second substrate, and the first interconnect, the second interconnect, and the sixth interconnect are provided on the surface and inside of the second substrate so as to pass through the second substrate in the first direction.

15. The semiconductor device according to claim 14, wherein the first electrode, the second electrode, and the third electrode of the light receiving element are bump electrodes.

16. The semiconductor device according to claim 12, further comprising:

a first output terminal and a second output terminal provided on the first substrate;

a fourth interconnect configured to electrically couple the first output terminal and a drain of the first transistor; and a seventh interconnect configured to electrically couple the second output terminal and a drain of the second transistor, wherein the fourth interconnect and the seventh interconnect are provided on the surface and inside of the first substrate so as to pass through the first substrate in the first direction.

17. The semiconductor device according to claim 12, wherein the first transistor and the second transistor are provided at positions intersecting the first substrate in a second direction intersecting the first direction.

* * * * *